United States Patent
Long et al.

(10) Patent No.: US 11,495,594 B2
(45) Date of Patent: Nov. 8, 2022

(54) ELECTROSTATIC PROTECTION CIRCUIT AND MANUFACTURING METHOD THEREOF, ARRAY SUBSTRATE AND DISPLAY DEVICE

(71) Applicant: BOE Technology Group Co., Ltd., Beijing (CN)

(72) Inventors: Chunping Long, Beijing (CN); Yong Qiao, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 600 days.

(21) Appl. No.: 16/340,186

(22) PCT Filed: Aug. 2, 2018

(86) PCT No.: PCT/CN2018/098275
§ 371 (c)(1),
(2) Date: Apr. 8, 2019

(87) PCT Pub. No.: WO2019/080577
PCT Pub. Date: May 2, 2019

(65) Prior Publication Data
US 2021/0398970 A1    Dec. 23, 2021

(30) Foreign Application Priority Data

Oct. 23, 2017    (CN) .......................... 201710994724.6

(51) Int. Cl.
*H01L 27/02*    (2006.01)
*H01L 27/12*    (2006.01)
*H02H 9/04*    (2006.01)

(52) U.S. Cl.
CPC ...... *H01L 27/0292* (2013.01); *H01L 27/1259* (2013.01); *H01L 27/0266* (2013.01);
(Continued)

(58) Field of Classification Search
CPC ............. H01L 27/0296; H01L 27/0292; H01L 27/0266–0285
See application file for complete search history.

(56) References Cited

U.S. PATENT DOCUMENTS

2005/0151462 A1* 7/2005 Miyagawa .......... H01L 27/3218
                                                     313/500
2007/0252229 A1* 11/2007 Fujimori ............... H01L 51/102
                                                     257/E21.133
(Continued)

FOREIGN PATENT DOCUMENTS

CN        202550507 U    11/2012
CN        104113053 A    10/2014
(Continued)

OTHER PUBLICATIONS

English Translation of CN 105304645 A. Translation completed on Nov. 5, 2021. (Year: 2021).*
(Continued)

*Primary Examiner* — Amar Movva
(74) *Attorney, Agent, or Firm* — Fay Sharpe LLP

(57) ABSTRACT

An electrostatic protection circuit and a manufacturing method thereof, an array substrate, and a display device are provided. The electrostatic protection circuit includes: at least one first transistor and at least one second transistor. A gate electrode and a first electrode of the first transistor are connected to a first signal line, and a second electrode of the first transistor is connected to a second signal line. A gate electrode and a first electrode of the second transistor are connected to the second signal line, and a second electrode of the second transistor is connected to the first signal line.

19 Claims, 9 Drawing Sheets

(52) U.S. Cl.
CPC ........ *H01L 27/124* (2013.01); *H01L 27/1222* (2013.01); *H02H 9/045* (2013.01)

(56) References Cited

U.S. PATENT DOCUMENTS

| | | | |
|---|---|---|---|
| 2010/0065887 A1* | 3/2010 | Goebel | H01L 29/045 257/192 |
| 2013/0207115 A1 | 8/2013 | Katsui et al. | |
| 2014/0145181 A1 | 5/2014 | Yamazaki et al. | |
| 2015/0144922 A1* | 5/2015 | Moon | H01L 51/5228 257/40 |
| 2015/0221680 A1 | 8/2015 | Nakata et al. | |
| 2015/0303686 A1 | 10/2015 | Li | |
| 2017/0110478 A1 | 4/2017 | Gai et al. | |
| 2018/0204829 A1 | 7/2018 | Cheng | |
| 2018/0204830 A1 | 7/2018 | Liu et al. | |

FOREIGN PATENT DOCUMENTS

| | | | |
|---|---|---|---|
| CN | 105304645 A * | 2/2016 | ........ H01L 27/0292 |
| CN | 105448224 A | 3/2016 | |
| CN | 105810677 A | 7/2016 | |
| CN | 205450520 U * | 8/2016 | ........ H01L 27/0296 |
| CN | 205810810 U | 12/2016 | |
| JP | 2005203351 A | 7/2005 | |
| JP | 2013251284 A | 12/2013 | |
| WO | 2014054483 A1 | 4/2014 | |
| WO | 2017128738 A1 | 8/2017 | |
| WO | 2017173779 A1 | 10/2017 | |

OTHER PUBLICATIONS

English Translation of CN 205450520 U . Translation completed on Nov. 5, 2021. (Year: 2021).*
Examination report of Indian application No. 201937045461 dated Jan. 29, 2021.
Extended European search report of counterpart EP application No. 18865335.6 dated Jun. 25, 2021.
First office action of Chinese application No. 201710994724.6 dated Apr. 21, 2020.
Zhihua Gu, Thin film transistor TFT array manufacturing technology, Sep. 30, 2007; pp. 321-324.
Notice of Reasons for Refusal of Japanese application No. 2019-563387 dated Sep. 12, 2022.

* cited by examiner

ELECTROSTATIC PROTECTION CIRCUIT AND MANUFACTURING METHOD THEREOF, ARRAY SUBSTRATE AND DISPLAY DEVICE

CROSS-REFERENCE TO RELATED APPLICATION

This application is a 371 of PCT Patent Application Serial No. PCT/CN2018/098275, filed on Aug. 2, 2018, which claims priority to Chinese Patent Application No. 201710994724.6, filed with the National Intellectual Property Administration of the P. R. China on Oct. 23, 2017 and entitled "ELECTROSTATIC PROTECTION CIRCUIT, ARRAY SUBSTRATE AND DISPLAY DEVICE", the entire contents of which are incorporated herein by reference.

TECHNICAL FIELD

The present disclosure relates to an electrostatic protection circuit and a manufacturing method thereof, an array substrate, and a display device.

BACKGROUND

As the resolution of a display device becomes higher and higher, signal lines disposed on the array substrate of the display device become denser and denser, and the spacing between adjacent signal lines also becomes smaller and smaller. Thus, defects such as current leakage or short circuit caused by static electricity more likely occur between adjacent signal lines. In order to ensure normal operation of the signal lines, an electrostatic protection device connected to the signal lines is disposed on the array substrate.

The electrostatic protection device in the related art generally includes a plurality of transistors and at least one electrostatic protection line such as a common electrode wire or a short circuit ring. Each of the transistors may be connected to one signal line and the electrostatic protection line respectively to discharge the static electricity generated on the signal line to the electrostatic protection line in time.

SUMMARY

The present disclosure provides an electrostatic protection circuit and a manufacturing method thereof, an array substrate, and a display device. The technical solutions are as follows.

In a first aspect, there is provided an electrostatic protection circuit, comprising: at least one first transistor and at least one second transistor; wherein a gate electrode and a first electrode of the first transistor are connected to a first signal line, and a second electrode of the first transistor is connected to a second signal line; a gate electrode and a first electrode of the second transistor are connected to the second signal line, and a second electrode of the second transistor is connected to the first signal line; wherein the first signal line and the second signal line are any two adjacent signal lines on an array substrate, and the first electrode and the drain electrode are one of a source electrode and a drain electrode, respectively.

Optionally, the first transistor is a thin film transistor, and the first transistor meets one of the following requirements: the gate electrode of the first transistor is disposed in the same layer as the first signal line; and the first electrode and the second electrode of the first transistor are disposed in the same layer as the first signal line.

Optionally, the second transistor is a thin film transistor, and the second transistor meets one of the following requirements: the gate electrode of the second transistor is disposed in the same layer as the second signal line; and the first electrode and the second electrode of the second transistor are disposed in the same layer as the second signal line.

Optionally, the first transistor is a thin film transistor; the first signal line comprises a first wire and a second wire which are disposed in different layers, and a lead portion of the first wire is connected to a lead portion of the second wire through a via hole disposed in a lead region; the gate electrode of the first transistor consists of the lead portion of the first wire, the first electrode of the first transistor consists of the lead portion of the second wire, and the second electrode of the first transistor consists of a lead portion of the second signal line.

Optionally, the second transistor is a thin film transistor; the second signal line comprises a third wire and a fourth wire which are disposed in different layers, and a lead portion of the third wire is connected to a lead portion of the fourth wire through a via hole disposed in a lead region; the gate electrode of the second transistor consists of the lead portion of the third wire, the first electrode of the second transistor consists of the lead portion of the fourth wire, and the second electrode of the second transistor consists of a lead portion of the first signal line.

Optionally, a width to length ratio of a channel of each of the transistors is less than or equal to one quarter.

Optionally, an orthographic projection of a channel of each of the transistors on the array substrate has a meandering serpentine shape.

Optionally, the first transistor meets at least one of the following requirements: an orthographic projection of a channel of the first transistor on the array substrate is within an orthographic projection of the first signal line on the array substrate; and an orthographic projection of the first electrode of the first transistor on the array substrate is within an orthographic projection of the first signal line on the array substrate.

Optionally, the second transistor meets at least one of the following requirements: an orthographic projection of a channel of the second transistor on the array substrate is within an orthographic projection of the second signal line on the array substrate; and an orthographic projection of the first electrode of the second transistor on the array substrate is within an orthographic projection of the second signal line on the array substrate.

Optionally, an orthographic projection of an end, close to a channel, of at least one of the first electrode and the second electrode of each of the transistors on the array substrate is triangular or trapezoidal, a tip of the triangle faces the channel, and an upper base of the trapezoid is close to the channel relative to a lower base thereof.

Optionally, an orthographic projection of an end of a channel, close to the first electrode, of each of the transistors on the array substrate is triangular or trapezoidal, and a tip of the triangle faces the first electrode, and an upper base of the trapezoid is close to the first electrode relative to a lower base thereof; and/or an orthographic projection of an end of a channel, close to the second electrode, of each of the transistors on the array substrate is triangular or trapezoidal, and a tip of the triangle faces the second electrode, and an upper base of the trapezoid is close to the second electrode relative to a lower base thereof.

In another aspect, there is provided a method of manufacturing an electrostatic protection circuit comprising: forming at least one first transistor and at least one second transistor; wherein a gate electrode and a first electrode of each of the first transistors are connected to a first signal line, and a second electrode of each of the first transistors is connected to a second signal line; a gate electrode and a first electrode of each of the second transistors are connected to the second signal line, and a second electrode of each of the second transistors is connected to the first signal line; and the first signal line and the second signal line are any two adjacent signal lines on an array substrate, and the first electrode and the drain electrode are one of a source electrode and a drain electrode, respectively.

Optionally, the first transistor is a thin film transistor, and the first transistor meets at least one of the following requirements: the gate electrode of the first transistor is formed together with the first signal line by one patterning process; and the first electrode and the second electrode of the first transistor are formed together with the first signal line by one patterning process.

Optionally, the second transistor is a thin film transistor, and the second transistor meets at least one of the following requirements: the gate electrode of the second transistor is formed together with the second signal line by one patterning process; and the first electrode and the second electrode of each of the second transistors are formed together with the second signal line by one patterning process.

Optionally, each of the first transistors is a thin film transistor; the first signal line comprises a first wire and a second wire which are formed in different layers, and a lead portion of the first wire is connected to a lead portion of the second wire through a via hole formed in a lead region; the gate electrode of each of the first transistors consists of the lead portion of the first wire, the first electrode of each of the first transistors consists of the lead portion of the second wire, and the second electrode of each of the first transistors consists of the lead portion of the second signal line.

Optionally, the second transistor is a thin film transistor; the second signal line comprises a third wire and a fourth wire which are disposed in different layers, and a lead portion of the third wire is connected to a lead portion of the fourth wire through a via hole disposed in a lead region; the gate electrode of the second transistor consists of the lead portion of the third wire, the first electrode of the second transistor consists of the lead portion of the fourth wire, and the second electrode of the second transistor consists of a lead portion of the first signal line.

In yet another aspect, there is provided an array substrate, comprising the electrostatic protection circuit as described in the above aspect.

Optionally, a plurality of signal lines are disposed on the array substrate, and the electrostatic protection circuit is disposed between every two adjacent signal lines of the plurality of signal lines.

In still yet another aspect, there is provided a display device, comprising the array substrate as described in the above aspect.

DETAILED DESCRIPTION

Figure 1:
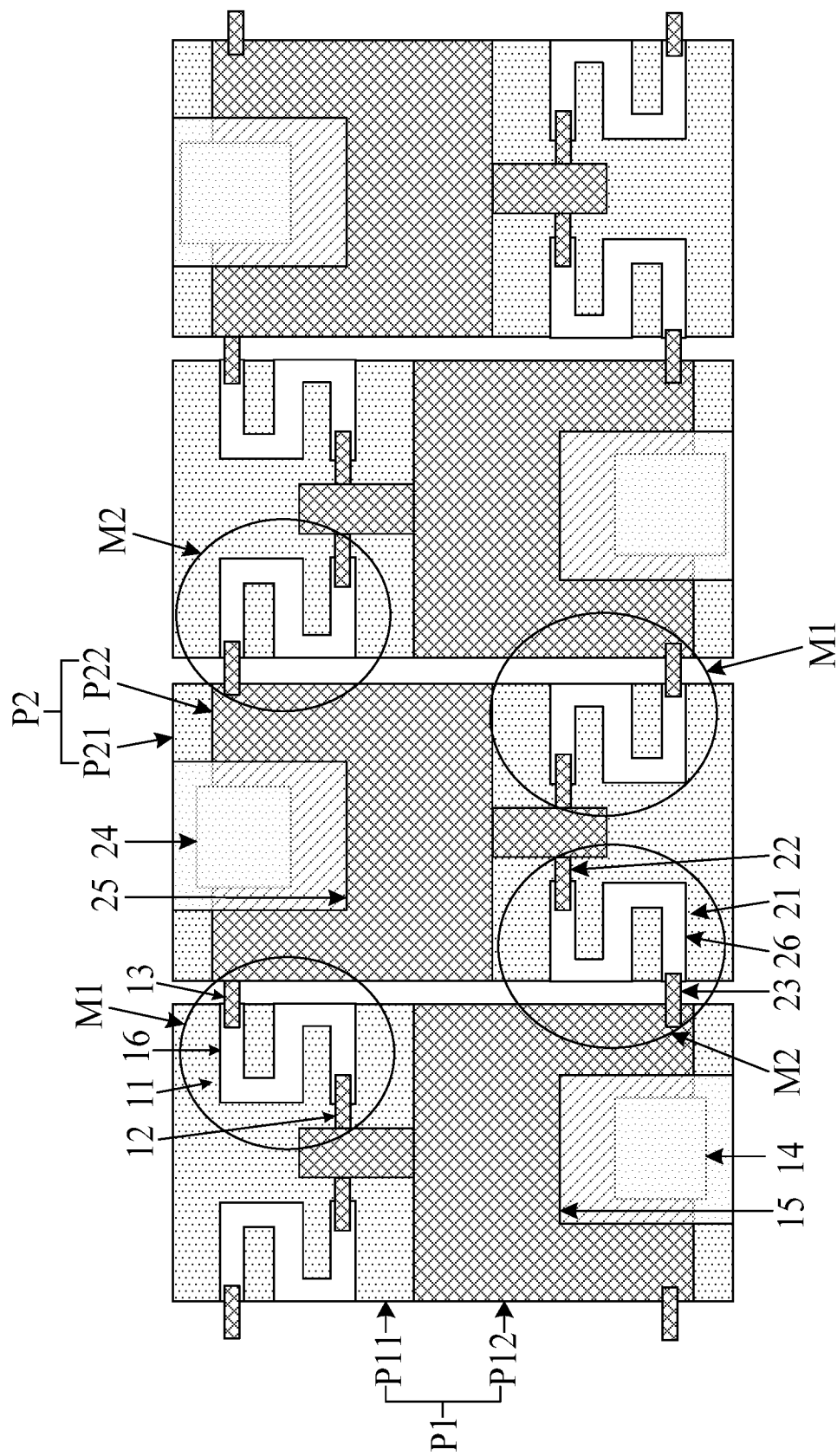
FIG. 1 is a schematic diagram of a structure of an electrostatic protection circuit according to an embodiment of the present disclosure.

The embodiments of the present disclosure will be described in further detail with reference to the accompanying drawings, to clearly present the principles and advantages of the present disclosure.

The transistors employed in the embodiments of the present disclosure may all be thin film transistors, and the transistors employed in the embodiments of the present disclosure are mainly switching transistors based on the functions thereof in the circuit. Since the source electrode and the drain electrode of the switching transistor employed here are symmetrical, the source electrode and the drain electrode thereof are interchangeable. In the embodiments of the present disclosure, the source electrode may be referred to as a first electrode and the drain electrode as a second electrode. Alternatively, the source electrode may be referred to as a second electrode and the drain electrode as a first electrode. According to the form of the transistor in the drawings, the intermediate terminal of the transistor is the gate electrode, the signal input terminal thereof is the source electrode, and the signal output terminal thereof is the drain electrode.

Figure 2:
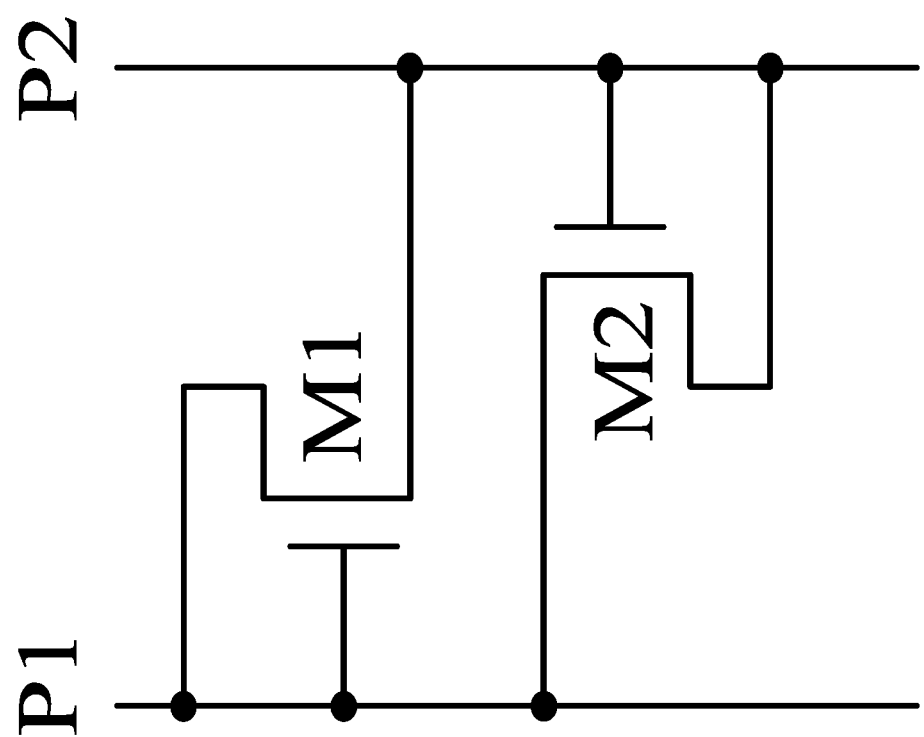
FIG. 2 is an equivalent circuit diagram of an electrostatic protection circuit according to an embodiment of the present disclosure.
Figure 3:
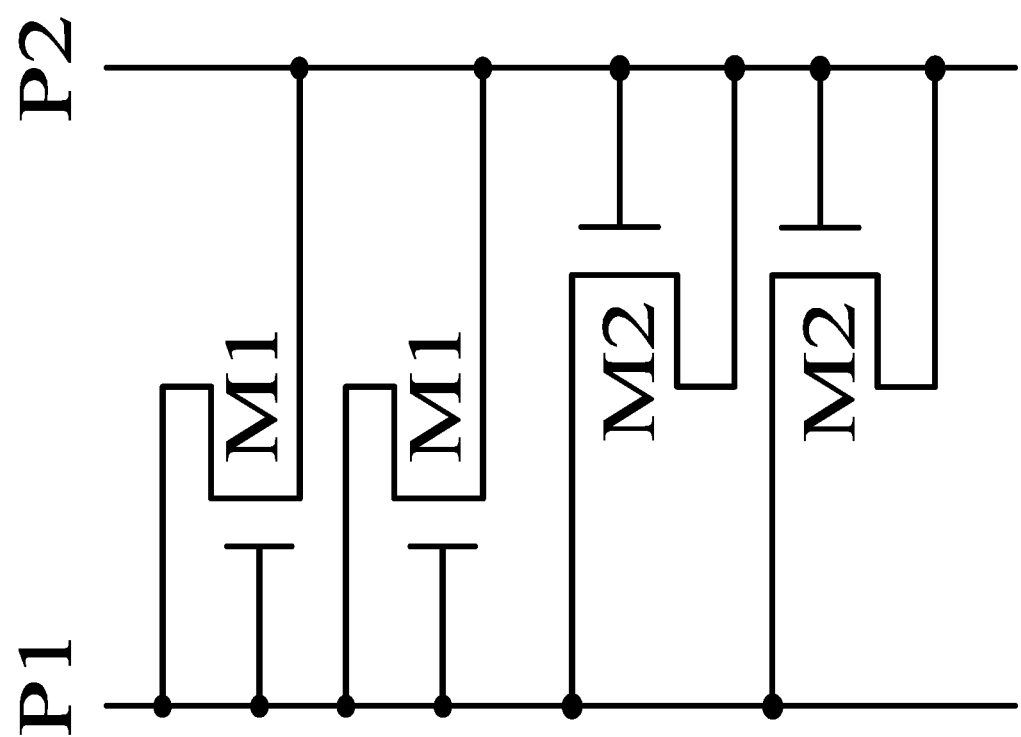
FIG. 3 is an equivalent circuit diagram of another electrostatic protection circuit according to another embodiment of the present disclosure.

An embodiment of the present disclosure provides an electrostatic protection circuit that may be applied to an array substrate. The electrostatic protection circuit may include at least one first transistor and at least one second transistor. FIG. 1 is a schematic diagram of a structure of an electrostatic protection circuit according to an embodiment of the present disclosure. FIG. 2 is an equivalent circuit diagram of an electrostatic protection circuit according to an embodiment of the present disclosure. As shown in FIG. 1 and FIG. 2, the electrostatic protection circuit may include one first transistor M1 and one second transistor M2. FIG. 3 is an equivalent circuit diagram of another electrostatic protection circuit according to an embodiment of the present disclosure. As shown in FIG. 3, the electrostatic protection circuit may include two first transistors M1 and two second transistors M2.

It can be seen in conjunction with FIG. 1 to FIG. 3 that the gate electrode 11 and the first electrode 12 of the first transistor M1 are connected to a first signal line P1, and the second electrode 13 of the first transistor M1 is connected to a second signal line P2. The gate electrode 21 and the first electrode 22 of the second transistor M2 are connected to the second signal line P2, and the second electrode 23 of the second transistor M2 is connected to the first signal line P1.

The first signal line P1 and the second signal line P2 may be any two adjacent signal lines on the array substrate. When static electricity is generated on the first signal line P1, the at least one first transistor M1 is turned on to connect the first signal line P1 with the second signal line P2, so that the static electricity generated on the first signal line P1 may be discharged to the second signal line P2. Correspondingly, when static electricity is generated on the second signal line P2, the at least one second transistor M2 is turned on to connect the second signal line P2 with the first signal line P1, so that the static electricity generated on the second signal line P2 may be discharged to the first signal line P1. Thereby, the static electricity accumulated on the signal line may be discharged to the adjacent signal line, thus reducing the probability that static electricity causes defects such as short circuit of the signal lines.

In the embodiment of the present disclosure, when the electrostatic protection circuit includes one first transistor M1 and one second transistor M2, the electrostatic protection circuit has a simple structure and a small occupied area. In the case where the electrostatic protection circuit includes a plurality of first transistors M1 and a plurality of second transistors M2, when one of the first transistors or one of the second transistors fails, the other transistors can still ensure that the electrostatic protection circuit operates normally. Thus, the reliability of the electrostatic protection circuit may be effectively improved. In the embodiment of the present disclosure, the amount of the first transistor and the second transistor in the electrostatic protection circuit may be flexibly selected according to the application requirements, which is not limited in the embodiment of the present disclosure.

In summary, the electrostatic protection circuit according to the embodiment of the present disclosure includes at least one first transistor and at least one second transistor. The gate electrode and the first electrode of the first transistor are connected to a first signal line, and the second electrode of the first transistor is connected to a second signal line. The gate electrode and the first electrode of the second transistor are connected to the second signal line, and the second electrode of the second transistor is connected to the first signal line. Therefore, when static electricity is generated on any one of the first signal line and the second signal line, the transistor whose gate electrode is connected to the signal line on which the static electricity is generated can discharge the static electricity to the other signal line, which realizes effective discharge of the static electricity, Thus, the probability that the static electricity cause defects such as short circuit of the signal lines is reduced. Moreover, the electrostatic protection circuit does not require additional wiring on the array substrate, and occupies less space, which is conducive to the implementation of the narrow frame display panel.

Optionally, in the embodiment of the present disclosure, both the first transistor M1 and the second transistor M2 may be thin film transistors.

The gate electrode 11 of the first transistor M1 may be disposed in the same layer as the first signal line P1. And the gate electrode 21 of the second transistor M2 may also be disposed in the same layer as the second signal line P2.

Alternatively, the first electrode 12 and the second electrode 13 of the first transistor M1 may be disposed in the same layer as the first signal line P1. And the first electrode 22 and the second electrode 23 of the second transistor M2 may also be disposed in the same layer as the second signal line P2.

Exemplarily, as shown in FIG. 1, both the gate electrode 11 and the first electrode 12 of the first transistor M1 are part of the first signal line P1, and both the gate electrode 21 and the first electrode 22 of the second transistor M2 are part of the second signal line P2. Thus, excessive extra space occupied by each transistor can be avoided and the utilization ratio of space of the array substrate can be improved.

Optionally, the electrostatic protection circuit according to the embodiment of the present disclosure may be disposed in a non-display area of the array substrate. For example, it may be disposed in a lead region (also referred to as a fan-out region) of the array substrate, and lead portions of the signal lines are disposed in the lead region.

Optionally, in the embodiment of the present disclosure, as shown in FIG. 1, the first signal line P1 may include a first wire P11 and a second wire P12 which are disposed in different layers. The lead portion of the first wire P11 is connected to the lead portion of the second wire P12 through a via hole 14 disposed in the lead region. Exemplarily, a conductive layer 15 may be formed in the via hole 14. The lead portion of the second wire P12 is connected to the conductive layer 15, and the conductive layer 15 is connected to the first wire P11, thereby realizing an effective connection between the second wire P12 and the first wire P11. The conductive layer 15 may be made of indium tin oxide (ITO).

The gate electrode 11 of the first transistor M1 may consist of the lead portion of the first wire P11, the first electrode 12 of the first transistor M1 may consist of the lead portion of the second wire P12, and the second electrode 13 of the first transistor M1 may consist of the lead portion of the second signal line P2.

Optionally, as shown in FIG. 1, the second signal line P2 may also include a third wire P21 and a fourth wire P22 which are disposed in different layers. The lead portion of the third wire P21 is connected to the lead portion of the fourth wire P22 through a via hole 24 disposed in the lead portion. Exemplarily, a conductive layer 25 (e.g., an ITO layer) is formed in the via hole 24. The lead portion of the fourth wire P22 is connected to the conductive layer 25, and the conductive layer 25 is connected to the third wire P21, thereby realizing an effective connection between the fourth wire P22 and the third wire P21.

The gate electrode 21 of the second transistor M2 may consist of the lead portion of the third wire P21, the first electrode 22 of the second transistor M2 may consist of the lead portion of the fourth wire P22, and the second electrode 23 of the second transistor may consist of the lead portion of the first signal line P1.

In the embodiment of the present disclosure, the first wire P11 of the first signal line P1 and the third wire P21 of the second signal line P2 may be disposed in the same layer, and the second wire P12 of the first signal line P1 and the fourth wire P22 of the second signal line P2 may be disposed in the same layer. Correspondingly, as shown in FIG. 1, the second electrode 13 of the first transistor M1 may consist of the lead portion of the fourth wire P22, and the second electrode 23 of the second transistor M2 may consist of the lead portion of the second wire P12.

When the transistors in the electrostatic protection circuit are bottom-gate transistors, as shown in FIG. 1, the second wire P12 may be located at the side of the first wire P11 away from the array substrate, and the fourth wire P22 is also located at the side of the third wire P21 away from the array substrate. When the transistors in the electrostatic protection circuit are top-gate transistors, the second wire P12 may be located at the side of the first wire P11 close to the array substrate, and the fourth wire P22 is also located at the side of the third wire P21 close to the array substrate. In the embodiment of the present disclosure, the relative positional relationship between the two wires in each of the signal lines may be adaptively adjusted according to the specific structure of the transistors, which is not limited in the embodiment of the present disclosure.

In an optional implementation of the embodiment of the present disclosure, each of the wires in each of the signal lines may include a lead portion located in a lead region, and a wire portion extending toward a peripheral region.

Figure 4:
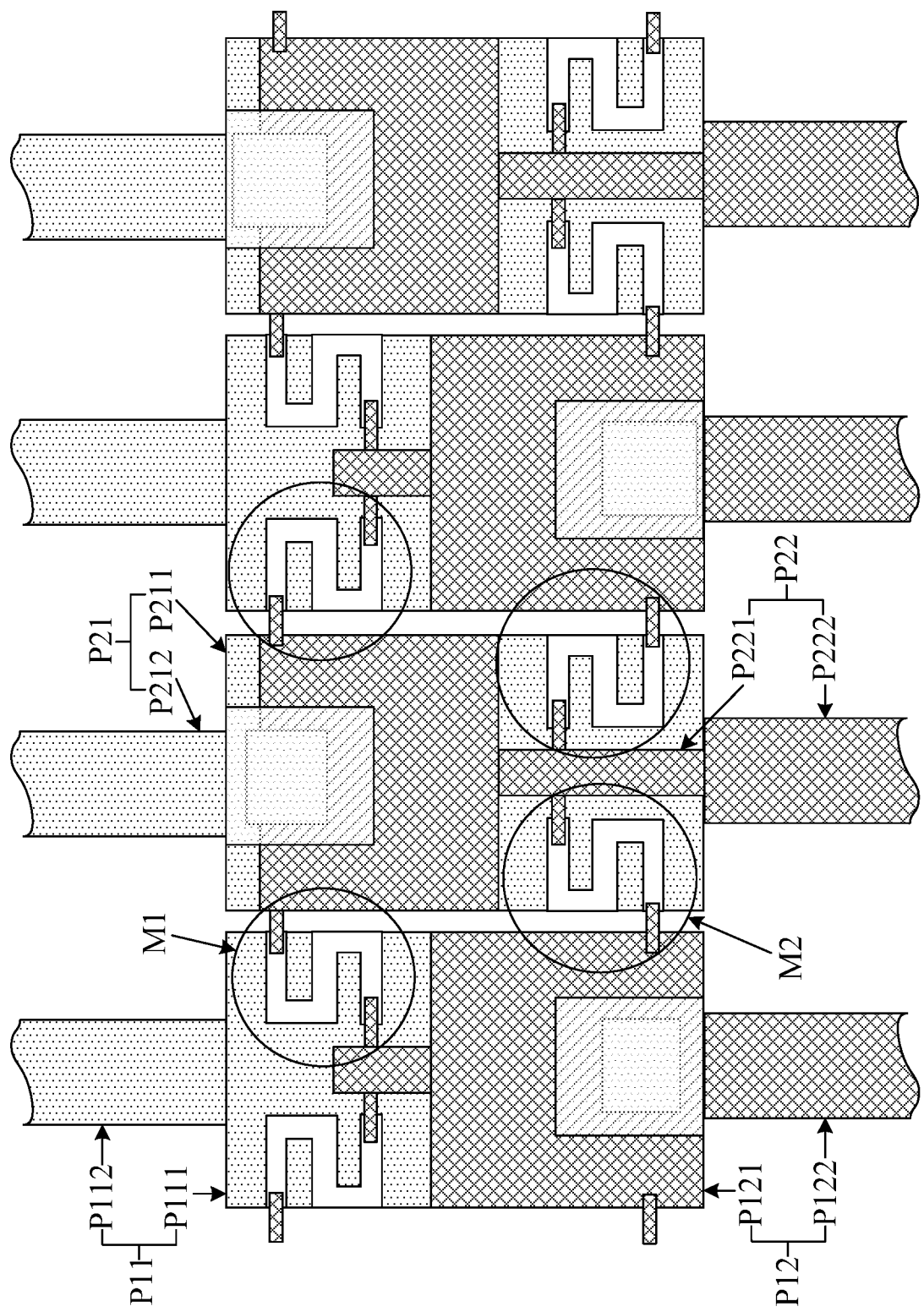
FIG. 4 is a schematic diagram of a structure of another electrostatic protection circuit according to yet another embodiment of the present disclosure.

Exemplarily, as shown in FIG. 4, the first wire P11 of the first signal line P1 may include a lead portion P111 located in the lead region, and a wire portion P112 extending toward the peripheral region (e.g., a crimp region, also referred to as a PAD region). Also, the second wire P12 may include a lead portion P121 located in the lead portion, and a wire portion P122 extending toward the peripheral region. Correspondingly, the third wire P21 of the second signal line P2 may include a lead portion P211 and a wire portion P212, and the fourth wire P22 may include a lead portion P221 and a wire portion P222.

In another optional implementation of the embodiment of the present disclosure, one of the wires of each of the signal lines may include a lead portion located in a lead region, and a wire portion extending toward a peripheral region. The other wire may include only the lead portion located in the lead region.

Figure 5:
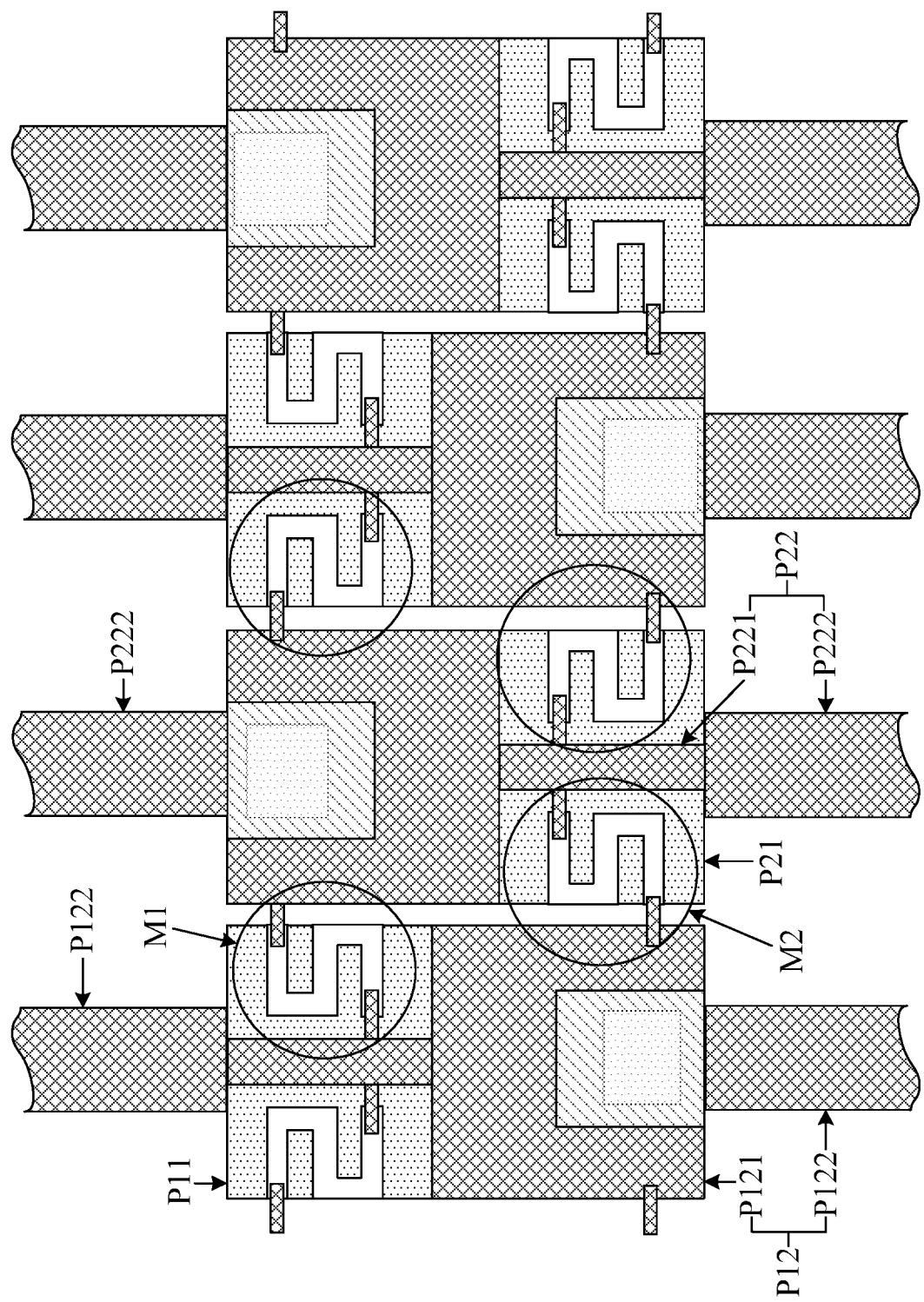
FIG. 5 is a schematic diagram of a structure of still another electrostatic protection circuit according to yet another embodiment of the present disclosure.

Exemplarily, as shown in FIG. 5, the first wire P11 of the first signal line P1 may include only the lead portion located in the lead region, and the second wire P12 may include a lead portion P121 located in the lead region and a wire portion P122 extending toward the peripheral region. Correspondingly, the third wire P21 of the second signal line P2 may include only the lead portion, and the fourth wire P22 may include a lead portion P221 and a wire portion P222.

Figure 6:
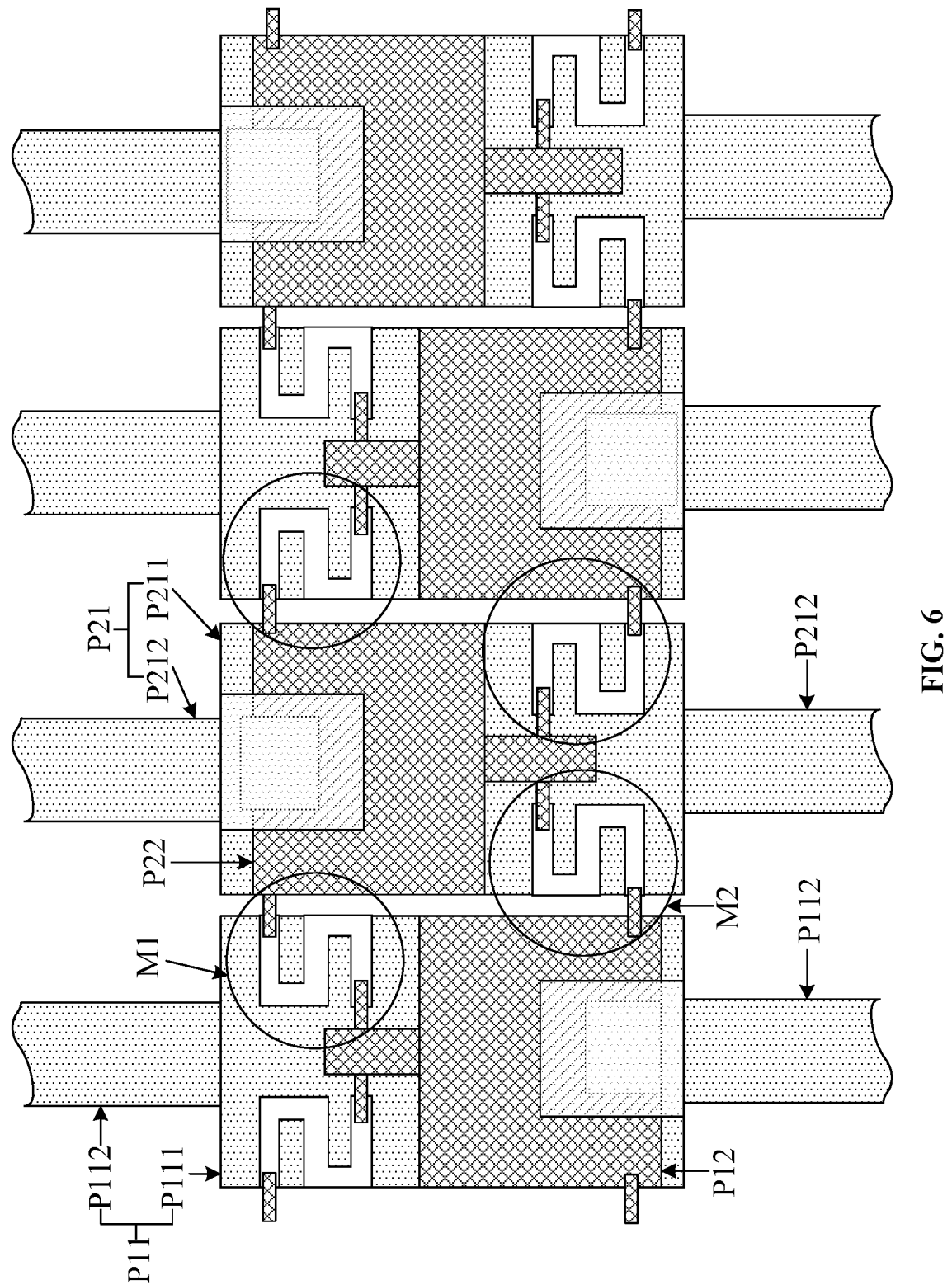
FIG. 6 is a schematic diagram of a structure of yet another electrostatic protection circuit according to yet another embodiment of the present disclosure.

Alternatively, as shown in FIG. 6, the first wire P11 of the first signal line P1 may include a lead portion P111 located in the lead region, and a wire portion P112 extending to the peripheral region; and the second wire P12 may include only the lead portion located in the lead region. Correspondingly, the third wire P21 of the second signal line P2 may include a lead portion P211 and a wire portion P212, and the fourth wire P22 includes only the lead portion.

In the embodiment of the present disclosure, the width to length ratio of the channel of each of the transistors may be less than or equal to one quarter. The width to length ratio of the channel may refer to the ratio of the width of the channel to the length of the channel. The current leakage of the transistor is proportional to the width to length ratio of the channel of the transistor, that is, the greater the width to length ratio of the channel is, the greater the current leakage of the transistor is. In the embodiment of the present disclosure, by controlling the width to length ratio of the channel of each of the transistors to be less than or equal to one quarter, the current leakage current of each of the transistors in the electrostatic protection circuit can be effectively reduced. That is, the magnitude of the current outputted to the adjacent signal line from each of the transistors can be reduced, and thereby the electrostatic protection capability of the electrostatic protection circuit can be effectively improved.

Optionally, in the electrostatic protection circuit according to the embodiment of the present disclosure, the orthographic projection of the channel of each of the transistors on the array substrate may have a meandering serpentine shape. Thus, when the width of the channel is held constant, the length of the channel can be effectively increased, and thereby the width to length ratio of the channel can be effectively reduced and the current leakage of the transistor can be reduced. Exemplarily, a top view of the channel of each of the transistors is shown in FIG. 1. As can be seen from FIG. 1, both the channel 16 of the first transistor M1 and the channel 26 of the second transistor M2 have a meandering serpentine shape.

It can also be seen from FIG. 1 that the orthographic projection of the channel 16 of the first transistor M1 on the array substrate may be located within the orthographic projection of the first signal line P1 on the array substrate. The orthographic projection of the channel 26 of the second transistor M2 on the array substrate may also be located within the orthographic projection of the second signal line P2 on the array substrate.

Optionally, the orthographic projection of the first electrode 12 of the first transistor M1 on the array substrate may be located within the orthographic projection of the first signal line P1 on the array substrate. The orthographic projection of the first electrode 22 of the second transistor M2 on the array substrate may also be located within the orthographic projection of the second signal line P2 on the array substrate.

By disposing the channel of the transistor and the first electrode of the transistor within the coverage area of the signal lines on the array substrate, it can avoid that the transistor in the electrostatic protection circuit occupies too much space, thereby effectively improving the space utilization ratio of the array substrate, which is conducive to the implementation of the narrow frame display panel.

Optionally, in the embodiment of the present disclosure, the orthographic projection of the end, close to the channel, of at least one of the first electrode and the second electrode of each of the transistors on the array substrate may be triangular or trapezoidal, and the tip of the triangle faces the channel, and the upper base of the trapezoid is close to the channel relative to the lower base thereof. Thus, the contact area between the first electrode of the transistor and the channel can be reduced, or the contact area between the second electrode of the transistor and the channel can be reduced, thereby further reducing the current leakage of the transistor and improving the electrostatic protection capability of the electrostatic protection circuit.

Figure 7:
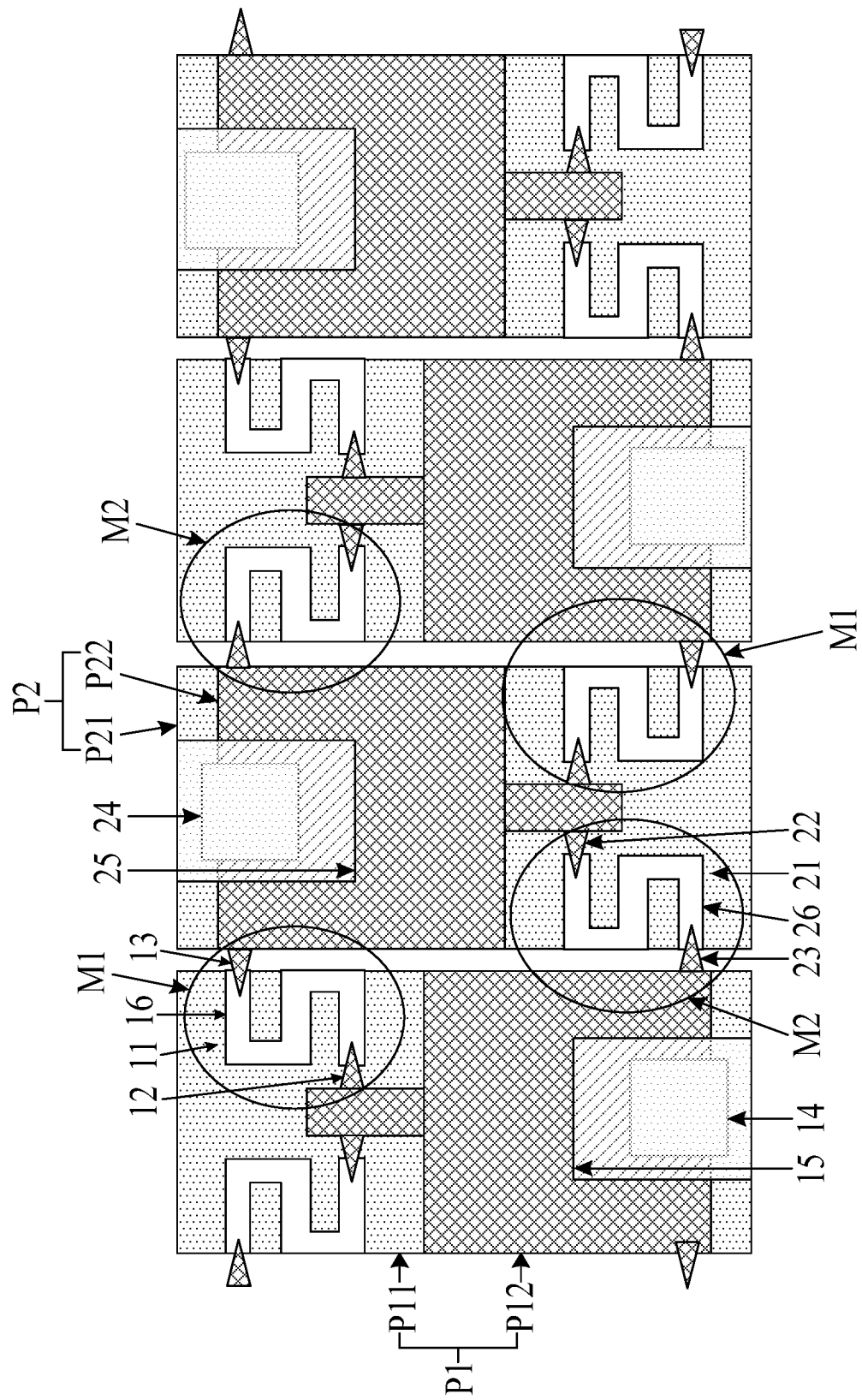
FIG. 7 is a schematic diagram of a structure of yet another electrostatic protection circuit according to yet another embodiment of the present disclosure.

FIG. 7 is a schematic diagram of a structure of yet another electrostatic protection circuit according to an embodiment of the present disclosure. As shown in FIG. 7, orthographic projections of the ends, close to the channel, of the first electrode and the second electrode of each of the transistors on the array substrate are both triangular, that is, the ends, close to the channel, of the first electrode and the second electrode of each of the transistors are both tip-shaped, so the current leakage of each of the transistors is small when the transistor is turned on.

Optionally, the orthographic projection of the end, close to the first electrode, of the channel of each of the transistors on the array substrate may be triangular or trapezoidal, and the tip of the triangle faces the first electrode, and the upper base of the trapezoid is close to the first electrode relative to the lower base thereof. Correspondingly, the orthographic projection of the end, close to the second electrode, of the channel of each of the transistors on the array substrate may also be triangular or trapezoidal, and the tip of the triangle faces the second electrode, and the upper base of the trapezoid is close to the second electrode relative to the lower base thereof. Thus, the contact area between the channel and the first electrode of the transistor and the contact area between the channel and the second electrode can be further reduced, thereby further reducing the current leakage of the transistor when the transistor is turned on.

Figure 8:
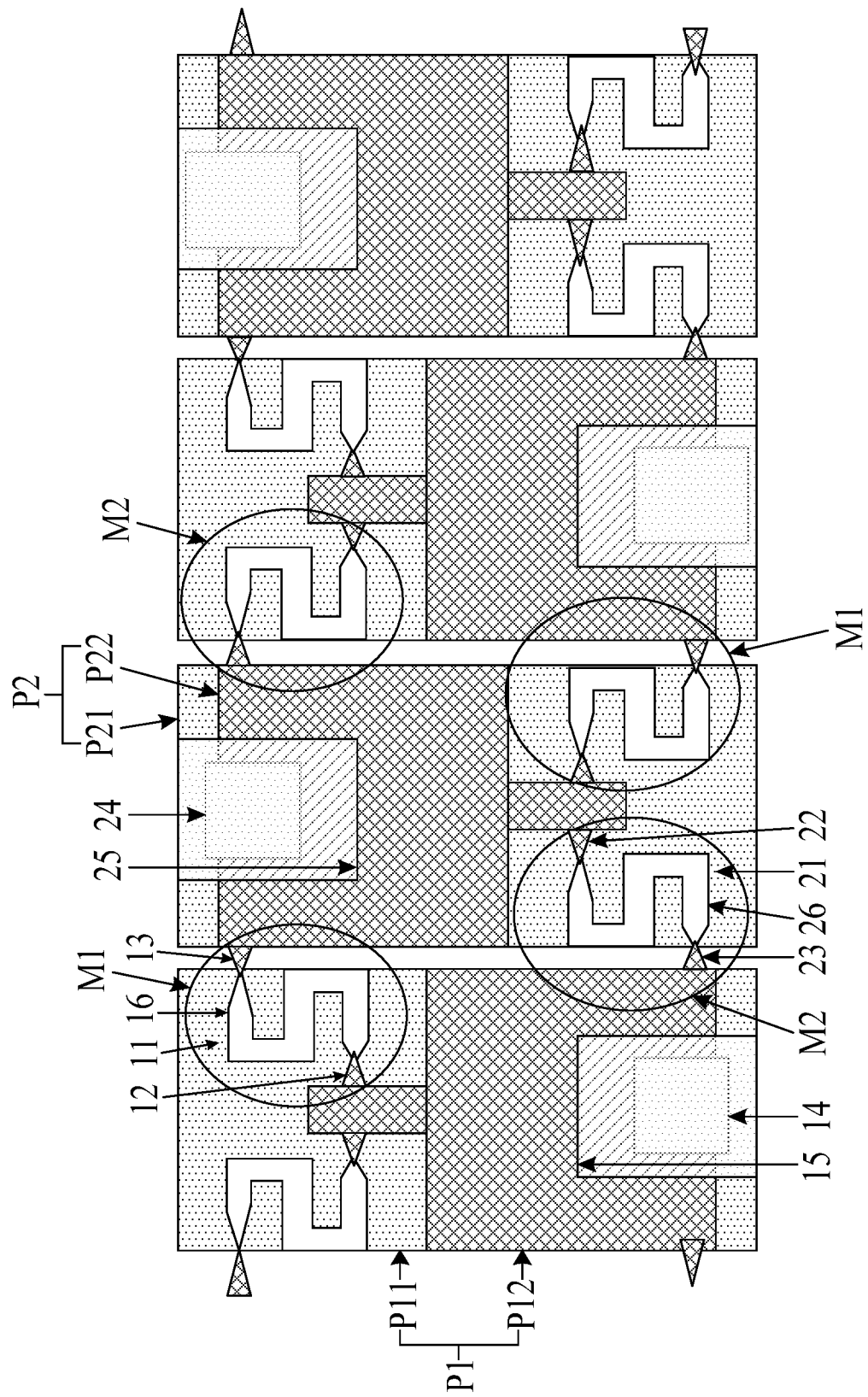
FIG. 8 is a schematic diagram of a structure of yet another electrostatic protection circuit according to yet another embodiment of the present disclosure.

Exemplarily, as shown in FIG. 8, the orthographic projection of the end of the channel, close to the first electrode, of each of the transistors on the array substrate, and the orthographic projection of the end of the channel, close to the second electrode, of each of the transistors on the array substrate are both triangular. Therefore, the current leakage of each of the transistors is small when the transistor is turned on, and the electrostatic protection capability of the electrostatic protection circuit is strong.

In summary, the embodiment of the present disclosure provides an electrostatic protection circuit, which includes at least one first transistor and at least one second transistor which are disposed between two adjacent signal lines. The first transistor can discharge static electricity generated by the first signal line to the second signal line, and the second transistor can discharge static electricity generated by the second signal line to the first signal line. Thus, defects such as short circuit caused by static electricity can be effectively avoided. Moreover, the electrostatic protection circuit does not require additional wiring on the array substrate, and occupies less space, which is conducive to the implementation of the narrow frame display panel.

Figure 9:
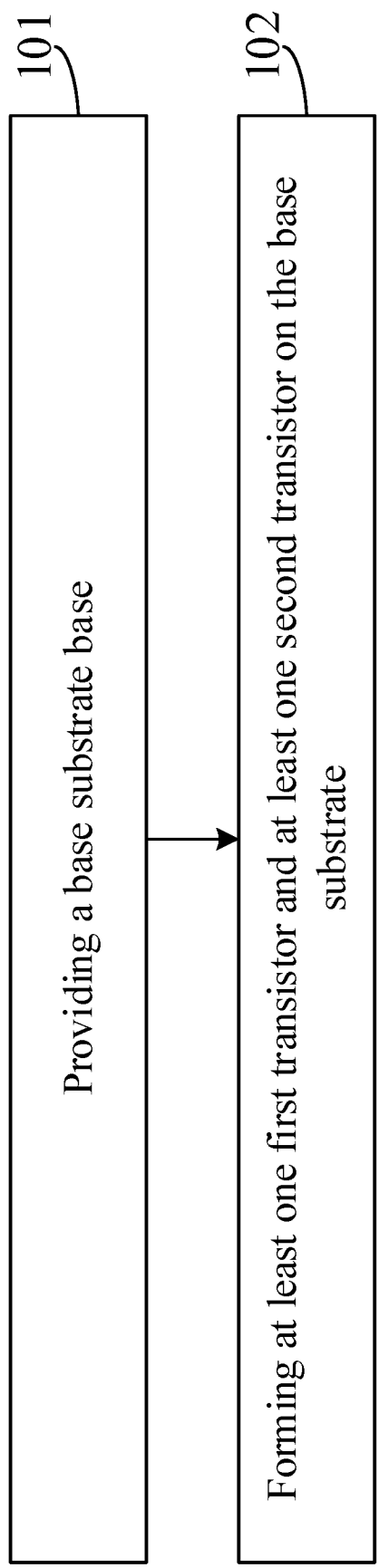
FIG. 9 is a flow chart of a method of manufacturing an electrostatic protection circuit according to an embodiment of the present disclosure.

FIG. 9 is a flow chart of a method of manufacturing an electrostatic protection circuit according to an embodiment of the present disclosure. The method may be used to manufacture the electrostatic protection circuit according to the above embodiments. Referring to FIG. 9, the method may include the following processes.

In step 101, a base substrate base is provided.

The base substrate may be a transparent glass substrate.

In step 102, at least one first transistor and at least one second transistor are formed on the base substrate.

The gate electrode and the first electrode of the first transistor are connected to the first signal line, and the second electrode of the first transistor is connected to the second signal line. The gate electrode and the first electrode of the second transistor are connected to the second signal line, and the second electrode of the second transistor is connected to the first signal line. The first signal line and the second signal line may be any two adjacent signal lines on the array substrate.

Optionally, both the first transistor and the second transistor in the electrostatic protection circuit may be thin film transistors.

As an optional implementation, in the above step 102, the gate electrode of the first transistor may be formed together with the first signal line by one patterning process. The gate electrode of the second transistor may be formed together with the second signal line by one patterning process. Moreover, the gate electrodes of all of the first transistors may be formed by one patterning process.

As another optional implementation, in the above step 102, the first electrode and the second electrode of the first transistor may be formed together with the first signal line by one patterning process. The first electrode and the second electrode of the second transistor may be formed together with the second signal line by one patterning process. Moreover, the first electrodes and the second electrodes of all the transistors may be formed by one patterning process.

In the embodiment of the present disclosure, when the gate electrode of each of the transistors and the signal lines are formed, a layer of metal thin film may be first prepared on the base substrate using a magnetron sputtering or evaporation process, etc. The metal thin film may then be patterned using a photolithography process to form the gate electrode of each of the transistors and the signal lines.

The photolithography process may include steps of photoresist coating, exposure, development, etching, and photoresist stripping, etc. The material of the metal thin film may be a film layer made of a low-resistance metal material, and may be, for example, a single-layer metal thin film made of material such as molybdenum (Mo), aluminum (Al), aluminum-nickel alloy, chromium (Cr) or copper (Cu), titanium (Ti) or AlNd, or may also be a multilayer metal thin film made of Mo/Al/Mo or Ti/Al/Ti.

Optionally, the first signal line may include a first wire and a second wire which are formed in different layers, and the lead portion of the first wire may be connected to the lead portion of the second wire through a via hole formed in the lead region. The gate electrode of the first transistor may consist of the lead portion of the first wire, the first electrode of the first transistor may consist of the lead portion of the second wire, and the second electrode of the first transistor may consist of the lead portion of the second signal line.

Optionally, similar to the first signal line, the second signal line may also include a third wire and a fourth wire which are disposed in different layers, and the lead portion of the third wire may be connected to the lead portion of the fourth wire through a via hole disposed in the lead region.

The gate electrode of the second transistor consists of the lead portion of the third wire, the first electrode of the second transistor consists of the lead portion of the fourth wire, and the second electrode of the second transistor consists of the lead portion of the first signal line.

In the embodiment of the present disclosure, the materials for forming the first electrode and the second electrode of each of the transistors may be similar to the material for forming the gate electrode, and the manufacturing process of forming the first electrode and the second electrode of each of the transistors may also be similar to the manufacturing process of forming the gate electrode, which will not be repeated here.

An embodiment of the present disclosure provides an array substrate, which may include the electrostatic protection circuit as shown in any of FIG. 1 to FIG. 8.

Optionally, a plurality of signal lines may be disposed on the array substrate. Referring to FIG. 1 and FIG. 4 to FIG. 8, it can be seen that an electrostatic protection circuit may be disposed between every two adjacent signal lines of the plurality of signal lines. If a signal line is adjacent to two signal lines respectively, two transistors may be disposed in the region covered by the signal line, and the two transistors are respectively connected to one adjacent signal line. For example, in the structure shown in FIG. 8, one second transistor M2 and one first transistor M1 are disposed in the region covered by the second signal line P2. The second transistor M2 is configured to connect the first signal line P1 on the left side of the second signal line P2, and the first transistor M1 is configured to connect the signal line on the right side of the second signal line P2.

When static electricity is generated on any one of the plurality of signal lines on the array substrate, in the electrostatic protection circuit, the transistor whose gate electrode is connected to the signal line which generates the static electricity may be turned on so as to connect the signal line which generates the static electricity with the adjacent signal line, so that the static electricity is discharged to the adjacent signal line. If the signal line which generates the static electricity discharges much static electricity, the transistor whose gate electrode is connected to the adjacent signal line may also be driven to be turned on, so that the static electricity is discharged to another signal line until the static electricity discharged to a certain signal line cannot drive the transistor to be turned on. Thereby, the effective discharge of static electricity on each of the signal lines can be realized, which reduces the probability of defects, such as current leakage or short circuit, caused by static electricity on the signal lines.

In the embodiment of the present disclosure, the signal lines on the array substrate may include any one of a gate line, a data line, a common electrode line, a clock signal line of a gate driving circuit, a test line or a repair line of the array substrate, and the like. The adjacent signal lines may be the same type of signal lines, or may be different types of signal lines, which is not limited in the embodiment of the present disclosure.

An embodiment of the present disclosure further provides a display device which may include an array substrate. The array substrate may include an electrostatic protection circuit as shown in any of FIG. 1 to FIG. 8. The display device may be any product or component having a display function such as a liquid crystal panel, an electronic paper, an OLED panel, an AMOLED panel, a mobile phone, a tablet computer, a television, a display, a notebook computer, a digital photo frame, a navigator, and the like.

The foregoing descriptions are only exemplary embodiments of the present disclosure, and are not intended to limit the present disclosure. Within the spirit and principles of the disclosure, any modifications, equivalent substitutions, improvements, etc., are within the protection scope of the appended claims of the present disclosure.

What is claimed is:

1. An electrostatic protection circuit, comprising: at least one first transistor and at least one second transistor, wherein
   a gate electrode and a first electrode of the first transistor are connected to a first signal line, and a second electrode of the first transistor is connected to a second signal line;
   a gate electrode and a first electrode of the second transistor are connected to the second signal line, and a second electrode of the second transistor is connected to the first signal line;
   wherein the first signal line and the second signal line are any two adjacent signal lines on an array substrate, and the first electrode and the second electrode are one of a source electrode and a drain electrode, respectively;
   an orthographic projection of an end, dose to a channel, of the first electrode and an orthographic projection of an end, dose to the channel, of the second electrode of each of the transistors on a main surface of the array substrate are both triangular,
   wherein the main surface is a surface of the array substrate with a largest area; orthographic projections of an first end and an second end of the channel of each of the transistors on the main surface of the array substrate are triangular, wherein the first end is an end of the channel close to the first electrode, and the second end is an end of the channel close to the second electrode; and a tip, facing the first electrode, of the triangle corresponding to the first end of the channel is aligned with a tip, facing the first end of the channel, of the triangle corresponding to the end of the first electrode, and a tip, facing the second electrode, of the triangle corresponding to the second end of the channel is aligned with a tip, facing the second end of the channel, of the triangle corresponding to the end of the second electrode; and the first transistor meets at least one of the following requirements: an orthographic projection of a channel of the first transistor on the main surface of the array substrate is within an orthographic projection of the first signal line on the main surface of the array substrate; and an orthographic projection of the first electrode of the first transistor on the main surface of the array substrate is within an orthographic projection of the first signal line on the main surface of the array substrate.

2. The electrostatic protection circuit according to claim 1, wherein the first transistor is a thin film transistor, and the first transistor meets one of the following requirements:
   the gate electrode of the first transistor is disposed in the same layer as the first signal line; and
   the first electrode and the second electrode of the first transistor are disposed in the same layer as the first signal line.

3. The electrostatic protection circuit according to claim 1, wherein the second transistor is a thin film transistor, and the second transistor meets one of the following requirements:
   the gate electrode of the second transistor is disposed in the same layer as the second signal line; and
   the first electrode and the second electrode of the second transistor are disposed in the same layer as the second signal line.

4. The electrostatic protection circuit according to claim 1, wherein the first transistor is a thin film transistor;
   the first signal line comprises a first wire and a second wire which are disposed in different layers, and a lead portion of the first wire is connected to a lead portion of the second wire through a via hole disposed in a lead region;
   the gate electrode of the first transistor consists of the lead portion of the first wire, the first electrode of the first transistor consists of the lead portion of the second wire, and the second electrode of the first transistor consists of a lead portion of the second signal line.

5. The electrostatic protection circuit according to claim 4, wherein the second transistor is a thin film transistor;
   the second signal line comprises a third wire and a fourth wire which are disposed in different layers, and a lead portion of the third wire is connected to a lead portion of the fourth wire through a via hole disposed in a lead region;
   the gate electrode of the second transistor consists of the lead portion of the third wire, the first electrode of the second transistor consists of the lead portion of the fourth wire, and the second electrode of the second transistor consists of a lead portion of the first signal line.

6. The electrostatic protection circuit according to claim 5,
   when both the first transistor and the second transistor are bottom-gate transistors, the second wire is located at a side of the first wire away from the array substrate, and the fourth wire is located at a side of the third wire away from the array substrate; or
   when both the first transistor and the second transistor are top-gate transistors, the second wire is located at a side of the first wire close to the array substrate, and the fourth wire is located at a side of the third wire close to the array substrate.

7. The electrostatic protection circuit according to claim 5, wherein the first wire further comprises a wire portion extending toward a peripheral region and the wire portion is connected to the lead portion of the first wire, or the second wire further comprises a wire portion extending toward a peripheral region and the wire portion is connected to the lead portion of the second wire; and the third wire further comprises a wire portion extending toward a peripheral region and the wire portion is connected to the lead portion of the third wire, or the fourth wire further comprises a wire portion extending toward a peripheral region and the wire portion is connected to the lead portion of the fourth wire.

8. The electrostatic protection circuit according to claim 1, wherein a width to length ratio of a channel of each of the transistors is less than or equal to one quarter.

9. The electrostatic protection circuit according to claim 1, wherein an orthographic projection of a channel of each of the transistors on the main surface of the array substrate has a meandering serpentine shape.

10. The electrostatic protection circuit according to claim 1, wherein the second transistor meets at least one of the following requirements:
an orthographic projection of a channel of the second transistor on the main surface of the array substrate is within an orthographic projection of the second signal line on the main surface of the array substrate; and
an orthographic projection of the first electrode of the second transistor on the main surface of the array substrate is within an orthographic projection of the second signal line on the main surface of the array substrate.

11. The electrostatic protection circuit according to claim 1, wherein both the first transistor and the second transistor are thin film transistor;
wherein the first signal line comprises a first wire and a second wire which are disposed in different layers, and a lead portion of the first wire is connected to a lead portion of the second wire through a via hole disposed in a lead region; and the second signal line comprises a third wire and a fourth wire which are disposed in different layers, and a lead portion of the third wire is connected to a lead portion of the fourth wire through a via hole disposed in a lead region;
the gate electrode of the first transistor consists of the lead portion of the first wire, the first electrode of the first transistor consists of the lead portion of the second wire, and the second electrode of the first transistor consists of a lead portion of the second signal line;
the gate electrode of the second transistor consists of the lead portion of the third wire, the first electrode of the second transistor consists of the lead portion of the fourth wire, and the second electrode of the second transistor consists of a lead portion of the first signal line;
an orthographic projection of a channel of the first transistor on the main surface of the array substrate and an orthographic projection of the first electrode of the first transistor on the main surface of the array substrate are both within an orthographic projection of the first signal line on the main surface of the array substrate;
an orthographic projection of a channel of the second transistor on the main surface of the array substrate and an orthographic projection of the first electrode of the second transistor on the main surface of the array substrate are both within an orthographic projection of the second signal line on the main surface of the array substrate; and the orthographic projection of the channel of each of the transistors on the main surface of the array substrate has a meandering serpentine shape, and a width to length ratio of the channel of each of the transistors is less than or equal to one quarter.

12. A method of manufacturing an electrostatic protection circuit comprising:
forming at least one first transistor and at least one second transistor;
wherein a gate electrode and a first electrode of the first transistor are connected to a first signal line, and a second electrode of the first transistor is connected to a second signal line; a gate electrode and a first electrode of the second transistor are connected to the second signal line, and a second electrode of the second transistor is connected to the first signal line; the first signal line and the second signal line are any two adjacent signal lines on an array substrate, and the first electrode and the second electrode are one of a source electrode and a drain electrode, respectively;
an orthographic projection of an end, close to a channel, of the first electrode and an orthographic projection of an end, close to the channel, of the second electrode of each of the transistors on a main surface of the array substrate are both triangular, wherein the main surface is a surface of the array substrate with a lamest area;
orthographic projections of an first end and an second end of the channel of each of the transistors on the main surface of the array substrate are triangular, wherein the first end is an end of the channel close to the first electrode, and the second end is an end of the channel close to the second electrode; and a tip, facing the first electrode, of the triangle corresponding to the first end of the channel of the channel is aligned with a tip, facing the first end of the channel, of the triangle corresponding to the end of the first electrode, and a tip, facing the second electrode, of the triangle corresponding to the second end of the channel is aligned with a tip, facing the second end of the channel, of the triangle corresponding to the end of the second electrode; and
the first transistor meets at least one of the following requirements:
an orthographic projection of a channel of the first transistor on the main surface of the array substrate is within an orthographic projection of the first signal line on the main surface of the array substrate; and
an orthographic projection of the first electrode of the first transistor on the main surface of the array substrate is within an orthographic projection of the first signal line on the main surface of the array substrate.

13. The method according to claim 12, wherein the first transistor is a thin film transistor, and the first transistor meets one of the following requirements:
the gate electrode of the first transistor is formed together with the first signal line by one patterning process; and
the first electrode and the second electrode of the first transistor are formed together with the first signal line by one patterning process.

14. The method according to claim 12, wherein the second transistor is a thin film transistor, and the second transistor meets one of the following requirements:
the gate electrode of the second transistor is formed together with the second signal line by one patterning process; and the first electrode and the second electrode of the second transistor are formed together with the second signal line by one patterning process.

15. The method according to claim 12, wherein the first transistor is a thin film transistor;
the first signal line comprises a first wire and a second wire which are formed in different layers, and a lead portion of the first wire is connected to a lead portion of the second wire through a via hole formed in a lead region;
the gate electrode of the first transistor consists of the lead portion of the first wire, the first electrode of the first transistor consists of the lead portion of the second wire, and the second electrode of the first transistor consists of the lead portion of the second signal line.

16. The method according to claim 12, wherein the second transistor is a thin film transistor;
the second signal line comprises a third wire and a fourth wire which are disposed in different layers, and a lead portion of the third wire is connected to a lead portion of the fourth wire through a via hole disposed in a lead region;
the gate electrode of the second transistor consists of the lead portion of the third wire, the first electrode of the second transistor consists of the lead portion of the fourth wire, and the second electrode of the second transistor consists of a lead portion of the first signal line.

17. An array substrate, comprising an electrostatic protection circuit which comprises at least one first transistor and at least one second transistor, wherein
a gate electrode and a first electrode of the first transistor are connected to a first signal line, and a second electrode of the first transistor is connected to a second signal line;
a gate electrode and a first electrode of the second transistor are connected to the second signal line, and a second electrode of the second transistor is connected to the first signal line;
wherein the first signal line and the second signal line are any two adjacent signal lines on an array substrate, and the first electrode and the second electrode are one of a source electrode and a drain electrode, respectively;
an orthographic projection of an end, close to a channel, of the first electrode and an orthographic projection of an end, close to the channel, of the second electrode of each of the transistors on a main surface of the array substrate are both triangular, wherein the main surface is a surface of the array substrate with a largest area;
orthographic projections of an first end and an second end of the channel of each of the transistors on the main surface of the array substrate are triangular, wherein the first end is an end of the channel close to the first electrode, and the second end is an end of the channel close to the second electrode; and a tip, facing the first electrode, of the triangle corresponding to the first end of the channel is aligned with a tip, facing the first end of the channel, of the triangle corresponding to the end of the first electrode, and a tip, facing the second electrode, of the triangle corresponding to the second end of the channel is aligned with a tip, facing the second end of the channel, of the triangle corresponding to the end of the second electrode; and
the first transistor meets at least one of the following requirements:
an orthographic projection of a channel of the first transistor on the main surface of the array substrate is within an orthographic projection of the first signal line on the main surface of the array substrate; and
an orthographic projection of the first electrode of the first transistor on the main surface of the array substrate is within an orthographic projection of the first signal line on the main surface of the array substrate.

18. The array substrate according to claim 17, wherein a plurality of signal lines are disposed on the array substrate, and the electrostatic protection circuit is disposed between every two adjacent signal lines of the plurality of signal lines.

19. A display device, comprising the array substrate according to claim 17.

* * * * *